United States Patent
Arroyo et al.

(10) Patent No.: US 7,338,818 B2
(45) Date of Patent: Mar. 4, 2008

(54) SYSTEMS AND ARRANGEMENTS TO ASSESS THERMAL PERFORMANCE

(75) Inventors: Ronald Xavier Arroyo, Austin, TX (US); Kenneth A. Bird, New Paltz, NY (US); William A. Ciarfella, Round Rock, TX (US); Bret Peter Elison, Rochester, MN (US); Gary Franklin Goth, Pleasant Valley, NY (US); Terrance Wayne Kueper, Rochester, MN (US); Thoi Nguyen, Austin, TX (US); Roger Donell Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 341 days.

(21) Appl. No.: 11/133,427

(22) Filed: May 19, 2005

(65) Prior Publication Data

US 2006/0263912 A1    Nov. 23, 2006

(51) Int. Cl.
*H01L 21/66*    (2006.01)
(52) U.S. Cl. .......................................... 438/14; 438/17
(58) Field of Classification Search ................ 438/10, 438/14, 15, 17, 18, 122
See application file for complete search history.

(56) References Cited

U.S. PATENT DOCUMENTS 6,873,049 B2 *   3/2005   Shi .......................... 257/750
7,157,320 B2 *   1/2007   Sasaki ........................ 438/170
2004/0023422 A1 *   2/2004   Miao et al. ................... 438/17
2004/0185612 A1 *   9/2004   Sasaki ........................ 438/205

* cited by examiner

Primary Examiner—Kevin M. Picardat
(74) Attorney, Agent, or Firm—Casimer K. Salys; Schubert Osterrieder & Nickelson PLLC

(57) ABSTRACT

Systems and arrangements to assess the thermal performance of a thermal solution based upon the ability of a device under test (DUT) to operate in accordance with electrical performance criteria are contemplated. Embodiments may include a tester to couple with the DUT to determine an operating junction temperature. In some embodiments, the measured junction temperature may be the operating junction temperature anticipated for the DUT in a customer installation. In other embodiments, the tester may comprise logic to calculate a projected, operating junction temperature based upon the measured junction temperature and known differences between the tester and a customer installation. Upon determining the operating junction temperature for the DUT at the customer installation, the operating junction temperature is compared against a maximum junction temperature for proper operation of the DUT. Advantageously, the maximum junction temperature may be varied based upon the project objective for a line of DUTs.

20 Claims, 4 Drawing Sheets

SYSTEMS AND ARRANGEMENTS TO ASSESS THERMAL PERFORMANCE

FIELD

The present invention generally relates to the field of assessing thermal performance. More particularly, the present invention relates to systems and arrangements to assess the thermal performance of a thermal solution based upon the ability of a device under test (DUT) to operate in accordance with electrical performance criteria.

BACKGROUND

Microelectronic components, such as semiconductors, generate a substantial amount of heat during operation. The heat is removed from the die of a component via a thermal assembly to assure that the die does not reach a temperature, often referred to as a junction temperature, which prohibits proper operation of the die or physically damages the die. For many components, the thermal assembly may comprise a thermally-conductive, dielectric interface material, often referred to as a thermal interface material (TIM), and a heat sink. In components that are more susceptible to damage such as processors, the thermal assembly may include, e.g., a first TIM, a lid, a second TIM, and a heat sink.

Today's demand for faster operations is forcing designers and manufacturers to increase the frequency or speed of operations of the components. As the frequency or speed of operations in a component increases, the amount of heat generated by the component increases. One major problem faced by manufactures is that the various layers of the thermal assembly trap heat against the die, raising the operating temperatures of the die unless the thermal assembly can be built to dissipate heat more rapidly.

As the thermal performance requirements for the thermal assemblies rise, manufacturers are forced to maintain higher manufacturing standards for the thermal assemblies to assure that heat is dissipated rapidly. The higher standards for thermal assemblies cause more thermal assemblies to fail and/or be reworked before components may be shipped to customers. Failing and reworking thermal assemblies at a manufactures' facility increases the costs of manufacturing the components.

One way to combat the lower yields and increased costs is to improve the accuracy of tests performed on the thermal assemblies to determine whether the thermal performance or conductivity of the assemblies fall within an acceptable heat dissipation range. Historically, manufacturers have gauged the performance of thermal assemblies based upon mechanical measurements of the thermal gap(s) between the die of a component and each subcomponent of the thermal assembly such as the heat sink. Thermal gaps may vary as a result of chip tilt, chip height, chip to chip co-planarity, heat sink to chip surface stack up tolerances, and thermal interface material (TIM) thermal property variances among other parameters. Often processor modules mechanical measurements are made in the bond, assembly, and test (BAT) line to either directly or indirectly assure that mechanical gap criteria are met for the subcomponent interfaces.

IBM and other manufacturers have discovered over the last couple of processor generations that, depending upon the module design and its second level attachment to a card and heat sink, the accuracy of the metrics used to determine acceptable thermal gap sizes is very poor. Even with statistical approaches some of the indirect methods for measuring gap thickness' are inadequate. The impact is that more margin is required in the processor speed sorts (hence fewer yielded parts to meet frequency requirements) to assure the system will operate flawlessly. This impact is very expensive.

To improve the accuracy of measurement of the thermal performance for thermal assemblies, several manufacturers have changed the primary quality metric for determining the integrity of thermal assemblies from a mechanical one to a thermal one. In particular, manufacturers determine the resulting thermal performance of the thermal assembly rather than mechanical measurements of the thermal gap(s), and pass or fail components based upon a comparison of the thermal performance against fixed, thermal performance criteria.

The fixed, thermal performance criteria may take into account the maximum junction temperature allowable for flawless operation calculated for the average die under worst-case conditions. More specifically, a customer or die manufacturer may calculate a maximum junction temperature for the average die based upon predicted performance range of the thermal assemblies under the worst-case conditions and fail dies that run hotter than the calculated junction temperature. The processor manufacturer or a customer may then provide the card assembly manufacturer with the calculated junction temperature for the average die to test the thermal assemblies under certain power conditions. After attaching the thermal assembly to the die, the card assembly manufacturer may determine the rate of heat dissipation of thermal assemblies based upon the calculated junction temperature and a measured junction temperature. The card assembly manufacturer may then determine whether the thermal assembly of a component dissipates heat rapidly enough to maintain the junction temperature for the average die within operable limits under the worst-case conditions. If the thermal conductivity of the thermal assembly dissipates heat rapidly enough, the component passes. If the thermal conductivity of the thermal assembly fails to dissipate heat rapidly enough, the component fails.

However, such current approaches fail many components that may operate within adequate operational parameters for flawless operation. For instance, dies may run hotter or cooler due to variances in conditions of production along an assembly line. Dies that tend to run cooler may fail the test criteria after assembly because the thermal conductivity of the thermal assembly does not dissipate heat rapidly enough for the average die but does dissipate heat rapidly enough for those cooler running dies. Further, higher power dies may fail the test criteria after assembly because the measured junction temperature is higher than that predicted for the average die but is still low enough for this higher power part to operate flawlessly.

Current approaches also fail many components that may operate within adequate operational parameters for flawless operation in a customer installation. For example, a worst-case condition may consider installation of a component in, e.g., a server, that will be located at a high altitude location, in a small, enclosed space that has no air conditioning system or other climate controls. However, the designated or typical customers for the components may install the components in a low altitude, large, air-conditioned space. Thus, utilizing the calculated junction temperature for the average die under the worst-case conditions may fail a significant number of components that would operate reliably in the designated or typical customer's installation.

Further, current approaches do not satisfactorily facilitate optimization of yield in accordance with project objectives. In particular, a given project objective may attempt to maximize yield, maximize yield of high performance components, maximize yield of components based upon reliability criteria, and/or fine-tune a balance between yield and high performance or reliability. However, current approaches place such a high weight on the performance for worst-case conditions that they provide very little flexibility, if any, to accommodate such project objectives.

SUMMARY

The problems identified above are in large part addressed by systems and arrangements to adjust resource accessibility based upon usage modes. One embodiment comprises a method to assess the thermal performance of a component having a thermal assembly coupled with a die. The method generally involves determining a maximum junction temperature to facilitate proper operation of the die in accordance with a project objective; determining an operating junction temperature for the die subject to operating conditions while coupled with the thermal assembly, the operating junction temperature being calculated if the operating conditions differ from operating conditions of a customer installation; and comparing the operating junction temperature with the maximum junction temperature to pass or fail the component.

Another embodiment comprises a system to assess the thermal performance of a component having a thermal assembly coupled with a die having a thermal sensor. The system may comprise a maximum temperature determiner to determine a maximum junction temperature for the die based upon a characterization of the die; and a tester adapted to couple with the component to provide operating conditions for the component, wherein differences between the operating conditions for the tester and a customer installation are determinable; to determine an operating junction temperature of the die while subject to the operating conditions based upon a characteristic of the thermal sensor; and to compare the maximum junction temperature with the operating junction temperature to pass or fail the component.

A further embodiment comprises machine-accessible medium containing instructions, which when executed by a machine, cause the machine to perform operations to assess the thermal performance of a component having a thermal assembly coupled with a die. The operations may comprise determining a maximum junction temperature to facilitate proper operation of the die in accordance with a project objective; determining an operating junction temperature for the die subject to operating conditions while coupled with the thermal assembly, the operating junction temperature being calculated if the operating conditions differ from operating conditions of a customer installation; and comparing the operating junction temperature with the maximum junction temperature to pass or fail the component.

BRIEF DESCRIPTION OF THE DRAWINGS

Other objects and advantages of the invention will become apparent upon reading the following detailed description and upon reference to the accompanying drawings in which, like references may indicate similar elements.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, systems and arrangements to assess the thermal performance of a thermal solution based upon the ability of a device under test (DUT) to operate in accordance with electrical performance criteria are disclosed. Embodiments may include a tester to couple with the DUT to determine an operating junction temperature. In some embodiments, the measured junction temperature may be the operating junction temperature anticipated for the DUT in a customer installation. In other embodiments, the tester may comprise logic to calculate a projected, operating junction temperature based upon the measured junction temperature and known differences between the tester and a customer installation.

Upon determining the operating junction temperature for the DUT at the customer installation, the operating junction temperature is compared against a maximum junction temperature for proper operation of the DUT. The maximum junction temperature may be selected based upon project objectives such as a project objective to maximize yield, maximize reliability, maximize yield of high performance components, maximize yield of components based upon reliability criteria, and/or fine-tune a balance between yield and high performance components or reliability. Advantageously, the maximum junction temperature may be varied based upon the project objective for a line of DUTs. In some embodiments, a project objective may be multi-faceted, passing and sorting DUTs, which satisfy different criteria. For example, a multi-faceted project objective may sort out 10% of the line for a first balance between yield and reliability and 80% for a second balance between yield and reliability. The distinction between the two resulting sorts may be the projected, operating junction temperatures acceptable for one or more different customer installations.

While portions of the following detailed discussion describe many embodiments comprising heat sinks, lids, and thermal interface materials (TIMs) in the thermal assemblies, upon review of the teachings herein, a person of ordinary skill in the art will recognize how the present invention may be implemented with any type of arrangement to remove heat from a die such as closed water or refrigeration loops, unlidded assemblies, coldplate assemblies, etc.

Figure 1:
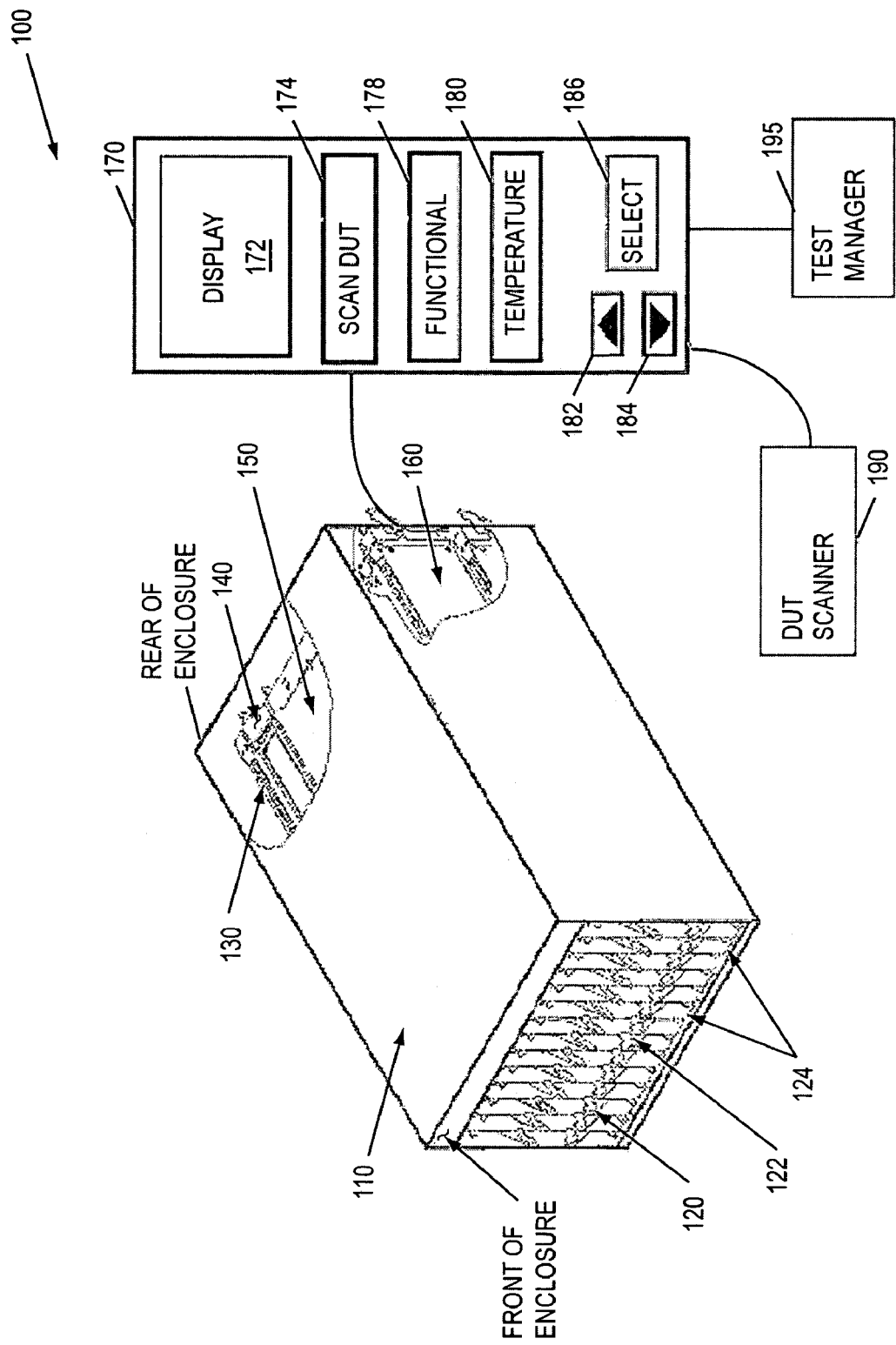
FIG. 1 depicts an embodiment of a system having a tester coupled with a test controller to test assembled components or devices under test (DUTs)
Figure 2:
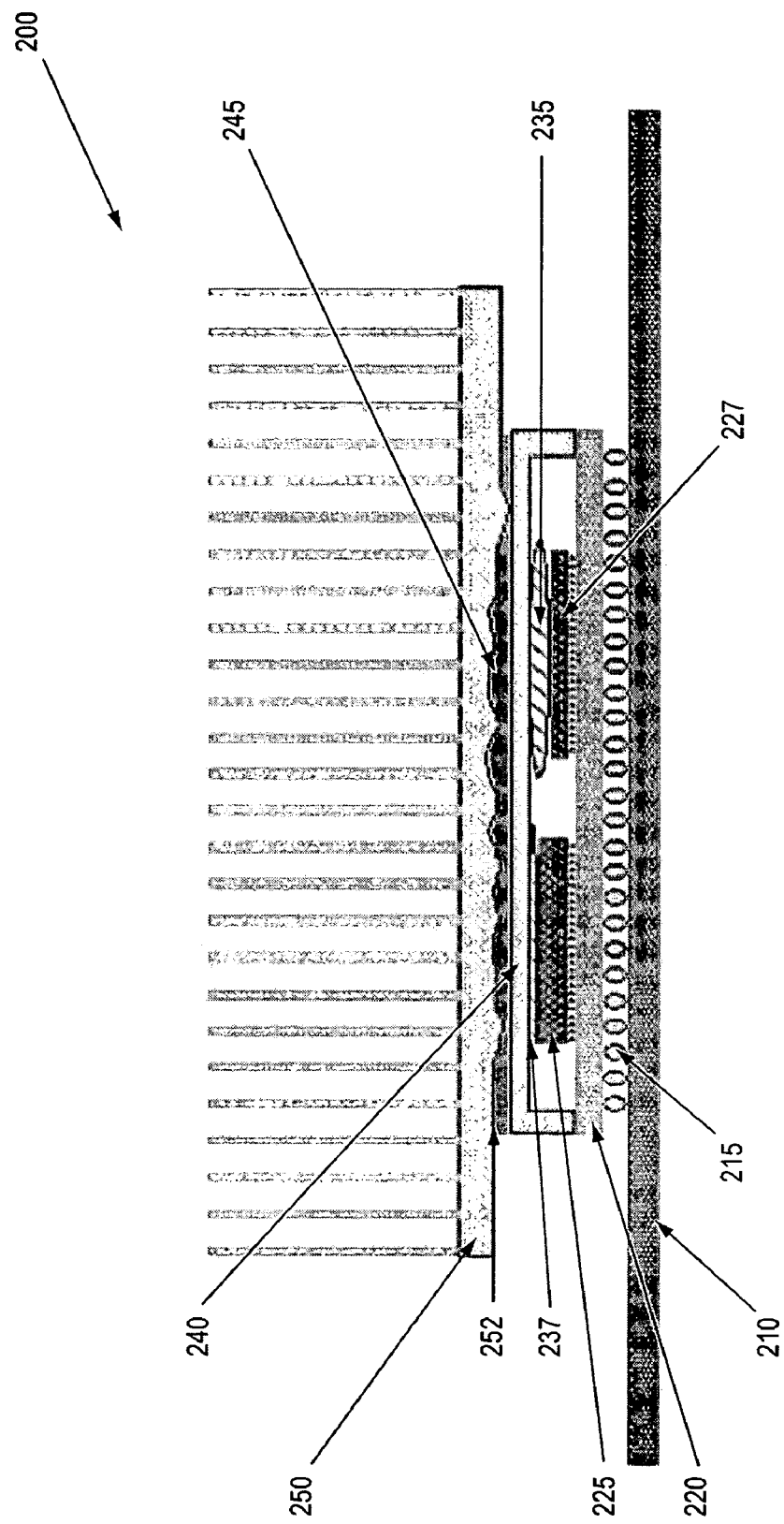
FIG. 2 depicts an embodiment of a DUT that includes multiple dies covered by a lid and coupled with a heat sink.

Turning to the drawings, FIG. 1 illustrates an embodiment of a system 100 to assess the thermal performance of a component. In this embodiment, system 100 is a blade server that supports a high spatial density of servers like servers 120 and 122 and provides cost-effective, extremely manageable, high-density rack servers. The component to be tested, referred to hereafter as the device under test (DUT), is part of a blade server 122. An embodiment of the DUT is illustrated in FIG. 2.

System 100 is chosen to test the thermal performance of the DUT to provide thermal conditions for the DUT that are substantially equivalent to a customer installation. System 100 also provides conditions for functional testing, or sorting, of the DUT. However, in the present embodiment, the cover typically fixed to the front of enclosure 110 is left off to facilitate insertion and removal of multiple blade servers during testing of a line of DUTs. In other embodiments, other types of enclosures may be utilized to test the DUT such as other types of servers, desktop computers, notebooks, personal digital assistants, or the like, depending upon the anticipated usage of the DUT.

System 100 includes enclosure 110 coupled with a test controller 170 and a DUT scanner 190 and a test manager 195 coupled with test controller 170. Test controller 170 provides a user interface for a technician to allow the technician to power up server 122 and set environmental conditions for functional testing and temperature performance assessment of the DUT. Enclosure 110 houses servers such as 120 and 122, vents 124, a management controller module 130, a power module 140, a blower 150, and a switch module 160. Enclosure 110 may house multiple servers sharing common management controllers, power modules, switch modules, blowers, and switch modules to reduce the number of potential component failures and the physical distribution of such support equipment. In many embodiments, connectors for server 122 may couple server 122 with such support modules to reduce wiring requirements and facilitate installation and removal of server 122. For instance, server 122 may couple with a gigabit Ethernet network via switch module 160 to facilitate testing of server 122. Advantageously, enclosure 110 may couple server 122 to test controller 170 without connecting cables directly to server 122. In other embodiments, the functionality of test controller 170 may be incorporated in management control module 130.

Enclosure 110 may also provide for hot-swappable units, allowing server 122 to be installed in an empty slot without powering down other components of enclosure 110, advantageously allowing the technician to quickly exchange DUTs between testing without significantly impacting environmental conditions within enclosure 110. Temperature sensors coupled with management controller 150 may monitor temperatures throughout enclosure 110 to verify and report environmental conditions for the DUT. In several embodiments, enclosure 110 also includes one or more disc drives, hard drives, compact disc (CD) drives, and digital versatile disc (DVD) drives to couple with the servers. The drives may facilitate installation of operating systems and other testing applications.

Servers 120 may include functioning single or multi-processor servers or may include dummy servers to provide selected environmental conditions within enclosure 110 for testing the DUT. Servers such as servers 120 and 122 include vents 124 to facilitate forced air intake and exhaust to remove heat produced by elements of the servers such as the DUT. In particular, a blower 150 may draw air from the front of enclosure, through servers 120 and 122, and exhaust the air through the back of blower 150 or the back of enclosure. In many embodiments, blower 150 is set to maintain a maximum speed for testing. In other embodiments, the speed of blower 150 may be monitored so the environmental conditions within enclosure 110 may be accurately characterized.

Management controller 130 may include thermal analysis software, firmware and or state machines to maintain temperatures throughout enclosure 110 for testing. In particular, management controller 130 may provide power to various elements within enclosure 110 to set environmental conditions and implement testing indicated by test controller 170. Management controller 130 may also maintain the topology of system 100 like the element content, interconnection of air paths between elements, and attributes of each element, including, e.g., the airflow impedances of elements such as servers 120 and 122, empty server slots, vents 124, management module 130, power module 140, blower 150, and switch module 160, as well as the characteristic curve of blower 150 to characterize the environmental conditions for the DUT.

Airflow impedances of individual elements may be combined (using, e.g., methods well known in the industry under the term Flow Network Modeling) to compute a single value that corresponds to the airflow impedance of the overall system. Likewise, the characteristic curves of the air-moving devices (which may, for instance, be described largely by attributes such as maximum pressure drop and maximum airflow rate) may be combined into system-level values. The intersection of the total system airflow impedance and the system level characteristic curve of all air-moving devices like blower 150 determines the pressure drop throughout the entire system and the airflow rate and pressure drops associated with the elements are determined from the pressure drop of the system and the individual impedances of the elements. Then, accumulating temperatures and temperature gradients can be determined from the ambient temperature at the intake vents of enclosure 110, typically room temperature, and the wattage dissipated and airflow through each of the individual elements. In several embodiments, management controller 130 may simulate multiple environmental conditions to facilitate testing under various environmental conditions.

Management controller 130 may couple with test controller 170 via switch module 160 to report the environmental conditions for the DUT. Management controller 130 may also couple with server 122 to report characteristics of one or more thermal sensors of the DUT. More specifically, the DUT may comprise a die that has one or more thermal sensors such as wires, diodes, transistors, or the like. Management controller 130 measures a characteristic of each thermal sensor in the die and transmits the measurement to test controller 170 to indicate the temperature of the die. The characteristic may comprise, e.g., a current through a wire, a diode forward voltage (i.e., for diodes, bipolar transistors, MOSFETs, etc.), a saturation voltage (i.e, for bipolar transistors), or a gate turn-on threshold (i.e., for bipolar transistors). Management controller 130 may then report the testing data along with data indicating the environmental conditions for the DUT during each test.

In some embodiments, the die of the DUT may include only one thermal sensor near the center of the die. In other embodiments, the die may include more than one thermal sensor to indicate temperatures at various locations of the die. For example, incorporating two thermal sensors at opposite corners of a die along a diagonal can provide additional temperature data for the die as well as indicate a tilt in the thermal assembly via differences in the thermal conductivity of the thermal assembly if a tilt exists.

Power supply module 140 may couple with elements of enclosure 110 to supply power requirements of elements within enclosure 110. In many embodiments, power supply module 160 couples with connectors of enclosure 110 to distribute power to each of the elements like servers 120 and 122, management controller 130, blower 150, and switch module 160. In such embodiments, power supplied to each element may be independent or isolated power to avoid the propagation or imposition of noise in power supplied to each of the elements in enclosure 110.

Blower 150 may force air through channels of enclosure 110 to remove heat dissipated by each of the elements and switch module 160 may include switching hardware and software or firmware to couple elements in enclosure 110 with a gigabit Ethernet network, a Fibre Channel network, or the like.

Test controller 170 may provide an interface for a technician to test each DUT in a line or bin of DUTs. The technician may select the scan DUT function 174 on test controller 170 and then scan a bar code on a DUT with DUT scanner 190 to identify the serial number of the DUT. Test controller 170 may communicate with test manager 195 to associate the serial number with information about the DUT such as the lot and bin associated with the die. In some embodiments, test manager 195 may also associate one or more customer installation models with the DUT for testing based upon the serial number. Test manager 195 may then transmit algorithms and/or software associated with the customer model(s) to test controller 170 to facilitate testing and evaluation of the DUT. For instance, test manager 195 may transmit data characterizing the environmental conditions anticipated for a customer installation so test controller 170 can determine whether the DUT passes or fails the temperature testing. In further embodiments, test manager 195 may determine a maximum junction temperature for the DUT based upon the serial number and transmit the maximum junction temperature to test controller 170.

In some embodiments, test manager 195 may communicate more than one maximum junction temperatures, or algorithms to calculate such, to test controller 170 to facilitate multi-faceted project objectives and/or to test dies that comprise multiple thermal sensors. The multi-faceted project objectives may pass DUTs with different maximum junction temperatures but sort these DUTs into different bins based upon, e.g., reliability and performance, or passage of the DUT in accordance with one or more customer installation models.

Once the DUT is scanned and testing data is received from test manager 195, the DUT is installed on server 122 and inserted into enclosure 110. The technician may then initiate the functional testing 178. Functional testing 178 may include, e.g., scan-based techniques and built-in techniques. For instance a circuit with scanable latches may propagate bit patterns through circuit elements and independently through a daisy chain of scanable latch circuits associated with the circuit elements. The scanable latch circuits include the latches necessary to coordinate transmission or propagation of data through various combinational logic circuits as well as scan path circuitry to coordinate evaluation of normal input with evaluation of the bit patterns for failure diagnostics. Built-in techniques may include generation of random bit patterns for inputs and evaluation of the outputs to determine whether the logic of the die is operating correctly.

During the functional testing 178, the temperature of the die of the DUT rises and once the temperature of the die rises to substantially a steady-state temperature for the environmental conditions, typically after several time constants, test controller 170 may indicate to the technician that temperature testing 180 may be initiated. In further embodiments, temperature testing 180 may be initiated automatically after the temperature of the die rises for several time-constants.

In response to initiation of temperature testing 180, test controller 170 requests a measurement of the characteristic of a thermal sensor in the die. Upon receipt of the measured characteristic such as a magnitude of a resistance, current, or voltage, test controller 170 evaluates the characteristic based upon the calibration data for the thermal sensors to determine measured junction temperature at the location of the thermal sensor. In further embodiments, characteristics of multiple thermal sensors in the die may be read and transmitted to test controller 170 for evaluation.

When the environmental conditions of enclosure 110 do not match the operating conditions of a customer installation model received from test manager 195, the operating junction temperature for the die is calculated by modifying the measured junction temperature to project the operating junction temperature based upon differences between the environment of enclosure 110 for the DUT and the environmental conditions characterized for the customer installation model. For instance, in the present embodiment, the front of enclosure 110 is left open to facilitate insertion and removal of server 122. If the only difference between the customer installation model and enclosure 110 is the removed panel, the operating junction temperature for the die of the DUT is projected based upon differences in the airflow through enclosure 110 as a result of the removed panel. For example, the differences may include differences between the system voltage during the test and the expected system voltage, the ambient temperature at the DUT and the expected ambient temperature, the code executing during the test and the expected code, and the operating frequency of the die during the test and the expected operating frequency at the customer installation.

Once the operating junction temperature for the die of the DUT is calculated, test controller 170 compares the operating junction temperature against the maximum junction temperature determined in accordance with the project objectives. This comparison may determine whether the DUT passes or fails. Advantageously, the time required for temperature testing 180 is hidden within the time required for functional testing 178. Further, more DUTs may pass temperature testing 180 because the maximum junction temperature is based upon the ability of the DUTs to function, or support electrical performance criteria, in an anticipated customer installation.

Navigation arrows 182 and 184 and select switch 186 may allow the technician to select between multiple customer installation models. As a result, test controller 170 may project the operating junction temperature of the DUTs via the multiple customer installation models and sort the DUTs based upon maintenance of an operating junction temperature at the die that is lower than the maximum junction temperature of at least one of the customer installation models.

Further, when the project objective(s) allow a percentage of DUTs to operate at increased temperatures to, e.g., maximize the yield of high-performance DUTs, test controller 170 may receive a higher maximum junction temperature for that percentage of DUTs and, thus, pass more DUTs to satisfy the percentage of higher-performance DUTs. On the other hand, if the DUT fails to fit any of the project objectives, test controller 170 may indicate that the DUT failed and the thermal assembly of the DUT may be reworked and retested or discarded.

In other embodiments, temperature testing 180 may be performed in a similar manner during burn-in testing. Bumin testing, also referred to as aging, runs the DUT at high temperatures, voltages, and currents to verify the integrity of the DUT. Once the temperature of the die rises to nearly a steady-state temperature for the environmental conditions during burn-in testing, temperature testing 180 may be implemented. Advantageously, the amount of time utilized for temperature testing 180 is small compared with the amount of time typically consumed by burn-in testing.

FIG. 2 depicts a device under test (DUT) 200 such as the DUT described in conjunction with FIG. 1. DUT 200 comprises chips 225 and 227 mounted in a thermal assembly on a printed circuit board 210. Chips 225 and 227 include dies mounted to a substrate 220, which is soldered to printed circuit board 210 with connectors 215 to facilitate electrical connections between the inputs and outputs of chips 225 and 227 and printed circuited board 210. Two such connections include a connection to a thermal sensor of chip 225 and a connection to the thermal sensor of chip 227. Management module 130 of FIG. 1 couples with these connections via printed circuit board 210 to measure the characteristics of the thermal sensors.

Thermal interface materials (TIMs) 237 and 235, such as a silicon-based or metal-alloy based grease or paste, is adapted to fill in gaps and conduct heat dissipated from the chips 225 and 227, respectively, to a module lid 240. Note that the height of TIM 235 is greater than the height of TIM 237. This difference contributes to differences in the thermal conductivity between chip 227 and heat sink 250 when compared with the thermal conductivity between chip 225 and heat sink 250.

Similarly TIM 245 fills in inconsistencies in the surfaces between module lid 240 and heat sink 250 to improve heat conduction from module lid 240 to heat sink 250. Because module lid 240 and heat sink 250 do not generally have smooth and planar surfaces, a relatively wide and irregular gap 252 may form between the surfaces of module lid 240 and heat sink 250. This gap can vary in size from less than 2 mils up to 20 mils or greater. Accordingly, TIM 245 must be of adequate thickness to fill the gap 252.

In other embodiments, chip 225 and chip 227 may be coupled with heat sink 240 via a TIM rather than through two layers of TIM and module lid 240. In still further embodiments, other types of thermal assemblies may be employed such as a refrigeration loop, pipe or vapor chamber heat sinks, a coldplate assembly, or other assembly for removing heat from chips 225 and 227.

Figure 3:
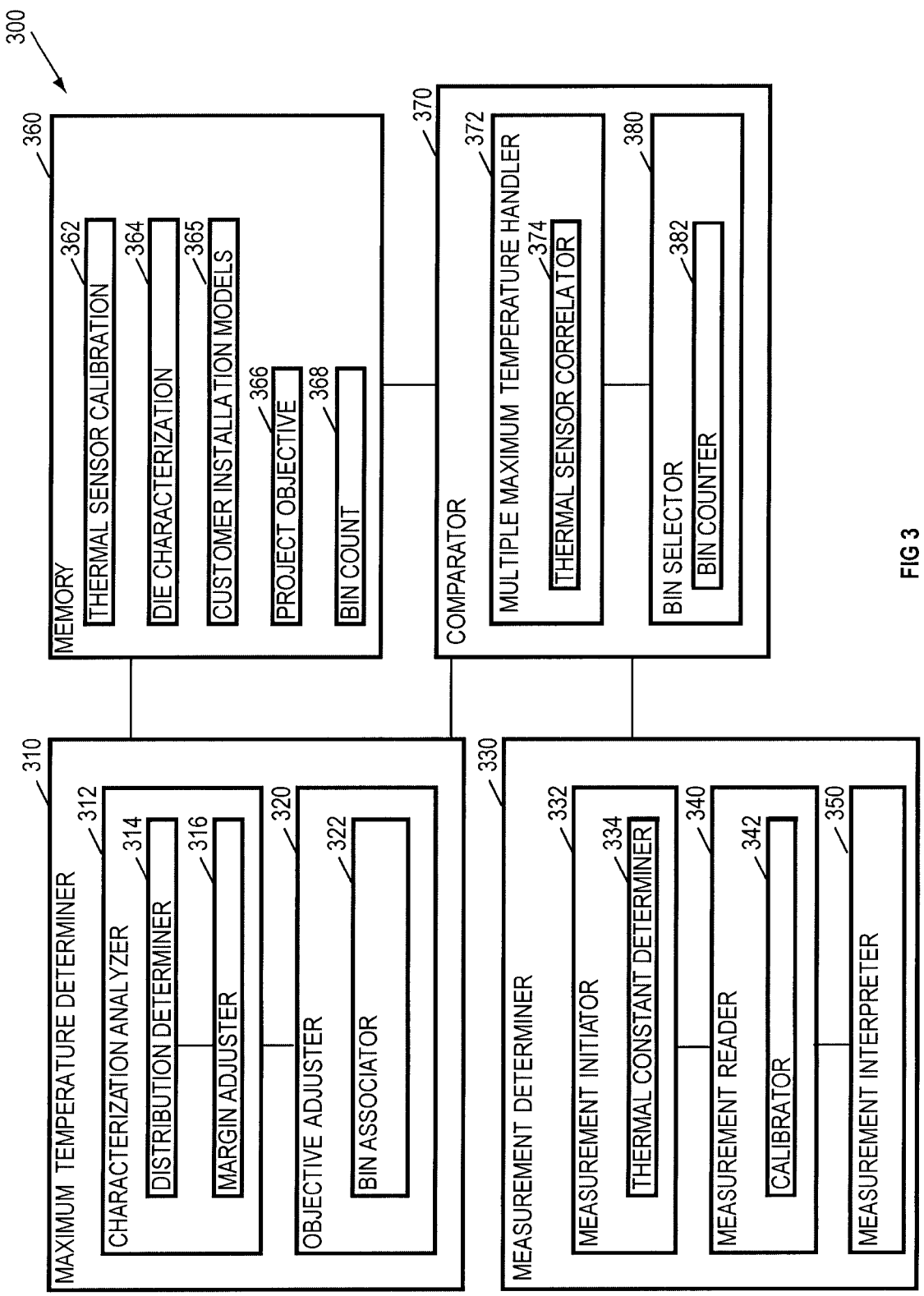
FIG. 3 depicts an embodiment of an apparatus to assess the thermal performance of a component such as the DUT in FIG. 2.

FIG. 3 depicts an embodiment of an apparatus 300 to assess the thermal performance of a component such as the DUT in FIG. 2. Apparatus 300 may calculate maximum junction temperatures taking into consideration, e.g, electrical performance criteria for a die of the DUT, customer installations, and project objectives. Apparatus 300 may then compare the maximum junction temperatures to operating junction temperature expected at customer installations to determine whether the thermal performance of DUT passes or fails. DUTs that pass the thermal assessment may further be sorted into bins for distribution to customer installations based upon an ability of the DUT to perform flawlessly in the customer installation, reliability of the DUT at the customer installation, performance of the DUT at the customer installation, and/or other criteria.

Apparatus 300 comprises a maximum temperature determiner 310, a measurement determiner 330, memory 360, and a comparator 370. Maximum temperature determiner 310 may determine one or more maximum junction temperatures for the DUT based upon a die characterization 364 stored in memory 360. Die characterization 364 may characterize the electrical performance criteria for the die for flawless operation as well as heat dissipation characteristics of the die based upon different types of processes or code executing on the die. In some embodiments, the DUT may include thermal sensors at different locations across the die so maximum temperature determiner 310 may calculate maximum junction temperatures for the different locations.

Maximum temperature determiner 310 comprises a characterization analyzer 312 and an objective adjuster 320. Characterization analyzer 312 may determine maximum junction temperatures for the die based upon one or more customer installation models 365 and die characterization 364 stored in memory 360. More particularly, the custom installations for which the DUTs are being manufactured may be known at least to some degree. For example, 20% of the DUTs produced may be designated for shipment to high altitude, low humidity climates and may reside in servers in facilities without air conditioning. Whereas the remaining 80% of the DUT's may be destined for customer installations that maintain strict climate controls. As a result, the maximum junction temperatures calculated for the strictly maintained environmental conditions may be higher because, e.g., reliability is rated higher in such installations, advantageously increasing yield of the DUTs for customer installations with strict climate controls.

Characterization analyzer 312 comprises distribution determiner 314 and margin adjuster 316. Distribution determiner 314 may utilize die characterization 364 to calculate maximum junction temperatures for the die based upon operations processed at the different locations in the die. Distribution determiner 314 may also take into account the electrical performance criteria for each of the locations to more accurately assess the thermal performance of the DUT. For instance, a first location of the die may include logic that is more susceptible to variations in the operating junction temperature than a second location of the die. As a result, distribution determiner 314 may determine a lower maximum junction temperature for the first location than the second location.

Margin adjuster 316 may adjust the maximum junction temperatures, taking into account anticipated variations in the environmental and operating conditions for the DUT. For instance, some customer installations may realize greater variations in the voltages so margin adjuster 316 may adjust the maximum junction temperatures to take into account the corresponding changes in the system voltage. Other variations may include changes in the ambient temperature, frequency of operation, and differences in code executed by the DUT or other components sharing the same environment with the DUT.

Objective Adjuster 320 may facilitate adjustments to the maximum junction temperatures based upon a project objective 366. Project objective 366 may include data that describes one or more project objectives for a line of DUTs. The project objectives may identify, for instance, adjustments to the maximum junction temperature to maximize yield, maximize reliability, maximize performance, balance yield with performance, and/or the like. Project objective 366 may also designate portions of the yield to be allocated for each of the different maximum junction temperatures. For instance, project objectives may describe a quantity of DUTs that meet the maximum junction temperature as adjusted for maximize yield, which may not meet the maximum junction temperature requirement for maximum reliability. In further embodiments, project objective 366 may identify different objectives and/or quantities for each of the customer installation models 365.

Objective adjuster 320 may comprise a bin associator 322. Bin associator 322 may associate different bins for the DUTs depending upon the project objective(s) that the DUT satisfies.

Measurement determiner 330 measures the junction temperature at the die of the DUT and adjusts the measured junction temperature, if necessary, to determine an operating junction temperature for the die. The operating junction temperature represents the projected junction temperature for the die when operating in a customer installation identified in customer installation models 365. Measurement determiner 330 comprises a measurement initiator 332, a measurement reader 340, and a measurement interpreter 350.

Measurement initiator 332 initiates measurement of a characteristic of a thermal sensor in the die. For instance, measurement initiator 332 may instruct a tester to perform the measurement and return the value to measurement initiator 332. Measurement initiator 332 may apply a voltage or current to the thermal sensor and the resulting voltage or current may be indicative of the characteristic.

Measurement initiator 332 may comprise a thermal constant determiner 334. Thermal constant determiner 334 may determine whether the die has reached a steady-state temperature by, e.g., measuring the time elapsed during burn-in testing or functional testing. In many embodiments, thermal constant determiner 334 may assure that several time constants have elapsed since the application of power to the die before measuring the junction temperature of the die. In further embodiments, the temperature of the die may be raised via means other than application of power such as raising the ambient temperature around the DUT, application of a coldplate to the DUT, or the like.

Measurement reader 340 may apply the voltage or current to the thermal sensor and capture the characteristic of the thermal sensor. Measurement reader 340 may include a calibrator 342. Calibrator 342 may read calibration data for the thermal sensor of the particular DUT from thermal sensor calibration 362 in memory 360 and calculate a measured junction temperature at the die based upon the captured characteristic and the calibration data for the thermal sensor.

Measurement interpreter 350 may adjust the measured junction temperature for the DUT to account for differences between the environmental and operating conditions of the DUT and the environmental and operating conditions represented by a customer installation in customer installation models 365. In some embodiments, measurement interpreter 350 may calculate operating temperatures for more than one of the customer installations represented in customer installation models 365.

Memory 360 may comprise any type of storage device such as disk drives, hard drives, random access memory (RAM), or the like. In several embodiments, memory 360 represents data storage devices in more than one physical location.

Comparator 370 may compare one or more maximum junction temperature determined by maximum temperature determiner 310 against one or more operating junction temperatures determined by measurement determiner 330 to decide whether the DUT passes or fails the thermal assessment testing. Comparator 370 may also sort passing DUTs into bins in accordance with maximum junction temperatures determined for various customer installation models 365 and/or project objectives 366.

Comparator 370 comprises a multiple maximum temperature handler 372 and a bin selector 380. Multiple maximum temperature handler 372 may determine how to use the multiple maximum junction temperatures received from maximum temperature determiner 310. For example, when maximum temperature determiner 310 passes maximum junction temperatures associated with different customer installation models 365 to comparator 370 for comparison against one or more operating junction temperatures from measurement determiner 330, multiple maximum temperature handler 372 coordinates comparison of corresponding temperatures. Multiple maximum temperature handler 372 may also comprise a thermal sensor correlator 374 to relate maximum junction temperatures with operating junction temperatures determined for different thermal sensors located in the die of the DUT.

Bin selector 380 may select a bin for each DUT in a line of DUTs tested based upon the maximum junction temperatures satisfied by the DUT. Bin selector 380 may also comprise a bin counter 382 to track the quantity of DUTs associated with each bin. If a DUT fails to satisfy all of the maximum junction temperatures associated with that DUT, the DUT may be placed in a bin for reworking the thermal assembly and/or replacing components. Further, if bin counter 382 determines that the bin count 368 for a bin into which a particular DUT may be sorted is full, bin counter 382 may fail the DUT even though the DUT satisfied some maximum junction temperatures. For example, a first bin may receive all the DUTs that meet the worst-case maximum junction temperatures because they may be distributed to any of the customer installations. However, project objectives may allow a DUT to pass thermal assessment testing when the DUTs that satisfy the maximum junction temperatures for a particular customer installation model. That customer installation model may only represent a small quantity of the designated customer installations so only a small quantity of DUTs may be sorted into the corresponding bin for that customer model. Once that bin is full, bin counter 380 may fail DUTs that would otherwise be placed in that bin so the DUTs can be reworked.

Figure 4:
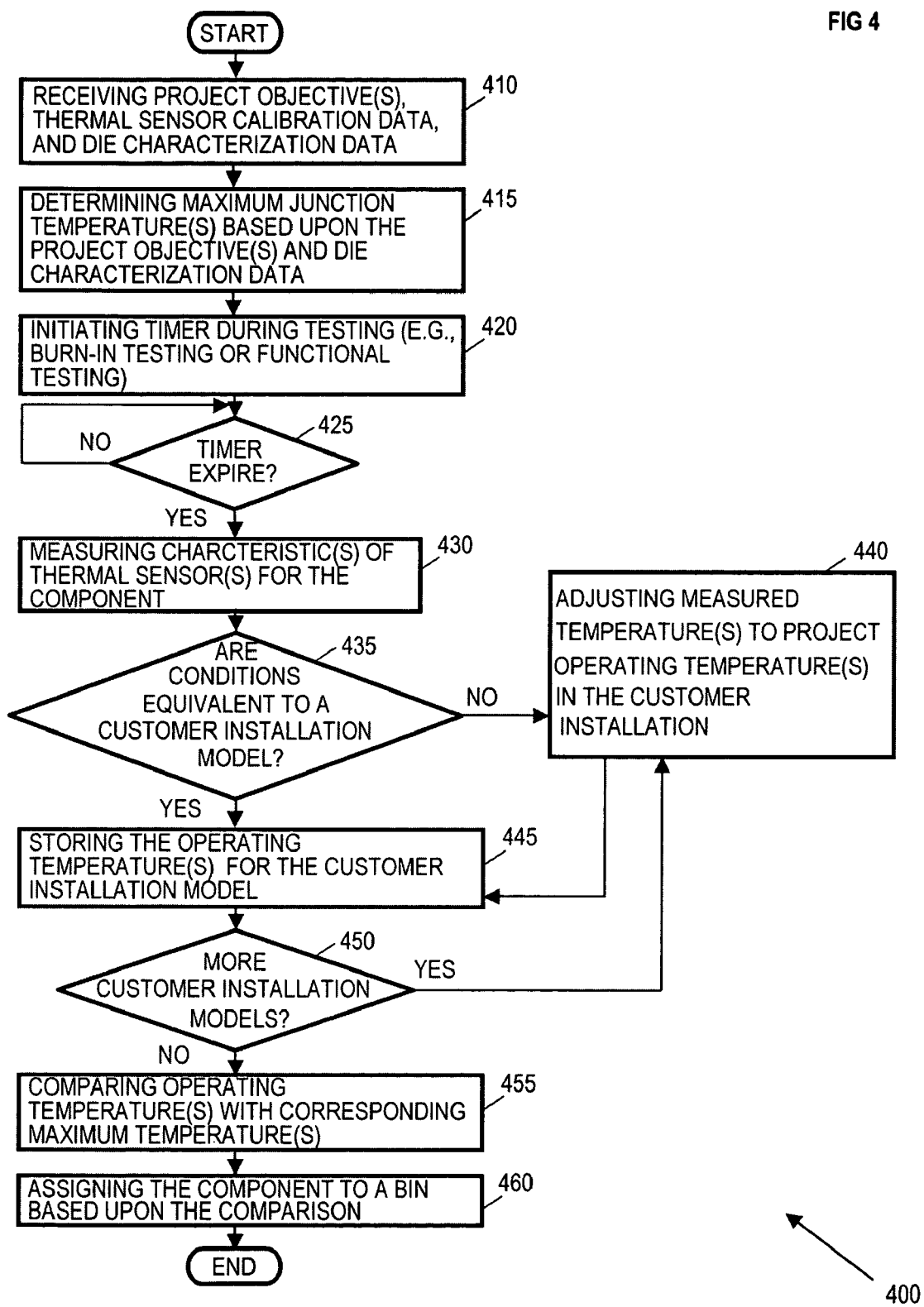
FIG. 4 depicts a flowchart of an embodiment to assess the thermal performance of a component.

FIG. 4 depicts a flowchart 400 of an embodiment to assess the thermal performance of a component such as the DUT discussed in conjunction with FIG. 1. Flowchart 400 describes operations for test equipment at a card assembly manufacture and may include operations occurring at a testing work station and/or operations that occur in a system that interacts with the testing work station. Flowchart 400 begins with receiving project objective(s), thermal sensor data, and die characterization data (element 410). The project objectives outline objectives in terms of quantities of DUTs to pass based upon an ability demonstrated by the DUTs to satisfy maximum junction temperatures adapted for the objectives such as maximizing yield, balancing reliability and yield, balancing reliability and performance, and/or the like. Thermal sensor calibration involves forcing the die to a known temperature, possibly at the die manufacturing facility, and then measuring a characteristic of the thermal sensor that varies with the temperature. For many types of thermal sensors, the data facilitates generation of a substantially linear calibration equation. Die characterization data includes data that characterizes electrical performance criteria for the die of the DUTs for flawless operation.

Flowchart 400 continues to determine maximum junction temperature(s) for the die of a DUT based upon the project objective(s) and the die characterization data (element 415). Such calculations may occur during burn-in testing and/or functional testing to hide the time involved with performing the calculations. In some embodiments, such calculations may be performed prior to receipt of the data by the card manufacturer and the results may be transmitted to the card manufacturer rather than, or in additional to, raw data for the project objectives and die characterization.

Once the card manufacturer begins testing of a DUT such as burn-in testing or functional testing, a timer may be initiated to determine when the die of the DUT substantially reaches a steady-state temperature (element 420). The timer may then expire after a number of time constants (element 425). The number of time constants is indicative of the quality or margin of error associated with measurement of the die temperature and, thus, may be accounted for in a determination of the measured junction temperature for the die.

After the timer expires, the test equipment applies a voltage and/or current to a thermal sensor in the die to determine a characteristic of the thermal sensor (element 430). The characteristic is indicative of the measured junction temperature. The measured junction temperature is then calculated based upon the thermal sensor calibration data.

If the conditions inherent to the test equipment are equivalent to the conditions that will be present at a customer installation, the measured temperature is considered the operating junction temperature for the die (element 435) and the measured junction temperature is stored for comparison against one or more maximum junction temperatures (element 445). On the other hand, if the conditions inherent to the test equipment are not equivalent to the conditions that will be present at a customer installation (element 435), the measured temperature is adjusted to correspond to the projected, operating junction temperature for the die at the customer installation (element 440). The projected, operating junction temperature is calculated based upon known differences between the customer installation model and the test equipment.

If additional customer installation models are available for the DUT (element 450), the measured junction temperature may be adjusted to determine corresponding operating junction temperatures for each customer installation model associated with the DUT (element 440).

Once an operating junction temperature for the die is determined, the test equipment may compare the operating junction temperature with the corresponding maximum junction temperature to determine whether the DUT passes or fails the thermal assessment testing (element 455). Advantageously, even if the operating temperature for the DUT fails in accordance with one or more of the customer installation models, the DUT may satisfy the maximum junction temperature for at least one of the models and pass the thermal assessment testing. The DUT may then be assigned to a bin based upon the customer installation model for which the DUT passed the thermal assessment testing (element 460).

Another embodiment of the invention is implemented as a program product for use with a system such as, for example, system 100 as shown in FIG. 1. The program(s) of the program product defines functions of the embodiments (including the methods described herein) and can be contained on a variety of data and/or signal-bearing media. Illustrative data and/or signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet and other networks. Such data and/or signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by a computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

It will be apparent to those skilled in the art having the benefit of this disclosure that the present invention contemplates methods and arrangements to assess the thermal performance of a thermal solution based upon the ability of a device under test (DUT) to operate in accordance with electrical performance criteria. It is understood that the form of the invention shown and described in the detailed description and the drawings are to be taken merely as examples. It is intended that the following claims be interpreted broadly to embrace all the variations of the example embodiments disclosed.

Although the present invention and some of its advantages have been described in detail for some embodiments, it should be understood that various changes, substitutions and alterations can be made herein without departing from the spirit and scope of the invention as defined by the appended claims. Further, embodiments may achieve multiple objectives but not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method to assess the thermal performance of a component having a thermal assembly coupled with a die, the method comprising:

determining a maximum junction temperature to facilitate proper operation of the die in accordance with a project objective;

determining an operating junction temperature for the die subject to operating conditions while coupled with the thermal assembly, the operating junction temperature being calculated if the operating conditions differ from operating conditions of a customer installation; and comparing the operating junction temperature with the maximum junction temperature to pass or fail the component.

2. The method of claim 1, further comprising determining another maximum junction temperature for testing a subsequent component based upon the project objective.

3. The method of claim 1, wherein determining the maximum junction temperature comprises characterizing the operating requirements for the component based upon expected system voltage, temperature, code, and frequency conditions.

4. The method of claim 3, wherein characterizing the operating requirements comprises characterizing the operating requirements for the component based upon one or more margins of error associated with the expected system voltage, temperature, code, and frequency conditions.

5. The method of claim 1, wherein determining the maximum junction temperature comprises determining more than one maximum junction temperatures and associating the more than one maximum junction temperatures with one or more bins.

6. The method of claim 1, wherein determining the maximum junction temperature comprises determining the maximum junction temperature to maximize yield.

7. The method of claim 1, wherein determining the maximum junction temperature comprises determining the maximum junction temperature to balance yield and reliability.

8. The method of claim 1, wherein determining the maximum junction temperature comprises determining the maximum junction temperature to balance yield and performance.

9. The method of claim 1, wherein determining the operating junction temperature comprises measuring a junction temperature at the die and calculating the operating junction temperature based upon differences between testing conditions and a customer installation.

10. The method of claim 1, wherein determining the operating temperature comprises determining calibration data for a thermal sensor, measuring a characteristic of the thermal sensor associated with the calibration data, and calculating the operating junction temperature based upon the calibration data.

11. A method to assess the thermal performance of a component having a thermal assembly coupled with a die, the method comprising:

determining more than one maximum junction temperatures for proper operation of the die in accordance with a multi-faceted project objective;

determining a margin of error for each of the more than one maximum junction temperatures;

measuring a junction temperature at the die under measurement operating conditions;

determining an operating junction temperature for the die while coupled with the thermal assembly based upon a difference between the measurement operating conditions and installation operating conditions associated with a customer installation; and comparing the operating junction temperature with the more than one maximum junction temperatures to pass or fail the component.

12. The method of claim 11, further comprising determining another set of maximum junction temperatures for testing a subsequent component based upon the multi-faceted project objective.

13. The method of claim 11, wherein determining the more than one maximum junction temperatures comprises characterizing the operating requirements for the component based upon expected system voltage, temperature, code, and frequency conditions.

14. The method of claim 11, wherein determining the more than one maximum junction temperatures comprises associating the more than one maximum junction temperatures with one or more bins.

15. The method of claim 11, wherein determining the more than one maximum junction temperatures comprises determining at least one maximum junction temperature to maximize yield, reliability, or performance.

16. A method to assess the thermal performance of a component having a thermal assembly coupled with a die, the method comprising:

receiving at least one maximum junction temperature to facilitate proper operation of the die in accordance with at least one project objective;

measuring at least one junction temperature from the die coupled with the thermal assembly, based upon calibration data for at least one thermal sensor in the die, under measurement operating conditions;

determining at least one operating junction temperature for the die subject to the measurement operating conditions after the die is coupled with the thermal assembly, the operating junction temperature being calculated based upon a difference between the measurement operating conditions and installation operating conditions of at least one customer installation; and comparing the at least one operating junction temperature with the at least one maximum junction temperature to associate the die with a bin.

17. The method of claim 16, further comprising associating different maximum junction temperatures with adjacent components based upon the at least one project objective.

18. The method of claim 16, wherein determining the at least one maximum junction temperature comprises determining a maximum junction temperature to maximize yield.

19. The method of claim 16, wherein determining the at least one maximum junction temperature comprises determining a maximum junction temperature to balance yield and reliability.

20. The method of claim 16, wherein determining the at least one maximum junction temperature comprises determining a maximum junction temperature to balance yield and performance.

* * * * *